(12) United States Patent
Numata

(10) Patent No.: US 11,173,558 B2
(45) Date of Patent: Nov. 16, 2021

(54) CONTROLLER AND POWER TOOL INCLUDING THE SAME

(71) Applicant: MAKITA CORPORATION, Anjo (JP)

(72) Inventor: Fumitoshi Numata, Anjo (JP)

(73) Assignee: MAKITA CORPORATION, Anjo (JP)

(*) Notice: Subject to any disclaimer, the term of this patent is extended or adjusted under 35 U.S.C. 154(b) by 256 days.

(21) Appl. No.: 16/409,918

(22) Filed: May 13, 2019

(65) Prior Publication Data

US 2019/0388983 A1 Dec. 26, 2019

(30) Foreign Application Priority Data

Jun. 20, 2018 (JP) ............................. JP2018-117116

(51) Int. Cl.
| | | |
|---|---|---|
| *G06F 1/16* | (2006.01) | |
| *H05K 5/00* | (2006.01) | |
| *H05K 7/00* | (2006.01) | |
| *B23D 45/16* | (2006.01) | |
| *B23D 59/00* | (2006.01) | |

(52) U.S. Cl.
CPC ........... *B23D 45/16* (2013.01); *B23D 59/001* (2013.01)

(58) Field of Classification Search
CPC ....... B23D 45/16; B23D 45/00; B23D 45/165
See application file for complete search history.

(56) References Cited

U.S. PATENT DOCUMENTS

| | | | |
|---|---|---|---|
| 7,764,502 B2* | 7/2010 | Erb | ........................... H01H 9/06 361/700 |
| 8,418,780 B2* | 4/2013 | Lau | ......................... B25F 5/008 173/171 |
| 8,803,377 B2 | 8/2014 | Lau | |
| 9,757,806 B2 | 9/2017 | Naito et al. | |
| 2006/0012254 A1 | 1/2006 | Einheuser et al. | |
| 2006/0091858 A1* | 5/2006 | Johnson | .............. H01M 50/213 320/128 |
| 2009/0145621 A1* | 6/2009 | Lau | ......................... B25F 5/008 173/217 |
| 2010/0155023 A1 | 6/2010 | Zhou et al. | |
| 2010/0253162 A1 | 10/2010 | Sakamaki et al. | |
| 2010/0254083 A1* | 10/2010 | Yang | ..................... F16B 35/045 361/695 |

(Continued)

FOREIGN PATENT DOCUMENTS

| | | |
|---|---|---|
| AU | 2003-254859 A1 | 3/2004 |
| CN | 101594969 A | 12/2009 |

(Continued)

OTHER PUBLICATIONS

Apr. 17, 2020 Office Action issued in U.S. Appl. No. 16/123,604.

(Continued)

*Primary Examiner* — Anthony M Haughton
(74) *Attorney, Agent, or Firm* — Oliff PLC

(57) ABSTRACT

A controller 50 that controls a power tool such as, for example, a portable circular saw includes a controller case 70 that houses an electric circuit board 60. Electric elements 61, 62 that generate heat and/or are to be cooled on the electric circuit board 60 contact a thick wall portion 73*b* of the controller case 70, resulting in heat dissipation resulting in effective cooling of the controller 50.

20 Claims, 14 Drawing Sheets

(56) References Cited

U.S. PATENT DOCUMENTS

| | | | |
|---|---|---|---|
| 2013/0098646 A1 | 4/2013 | Funabashi et al. | |
| 2016/0056681 A1 | 2/2016 | Major et al. | |
| 2017/0157760 A1* | 6/2017 | McAuliffe | B23D 49/16 |
| 2019/0252945 A1* | 8/2019 | Kviberg | H02K 7/145 |

FOREIGN PATENT DOCUMENTS

| | | | |
|---|---|---|---|
| CN | 101765351 | A | 6/2010 |
| CN | 101875168 | A | 11/2010 |
| CN | 102959826 | A | 3/2013 |
| CN | 103717031 | A | 4/2014 |
| EP | 2380707 | A1 | 10/2011 |
| JP | 2009-137011 | A | 6/2009 |
| JP | 2010-245531 | A | 10/2010 |
| JP | 2014-079812 | A | 5/2014 |
| WO | 2004/020138 | A1 | 3/2004 |
| WO | 2008/088017 | A1 | 7/2008 |
| WO | 2010/074006 | A1 | 7/2010 |

OTHER PUBLICATIONS

Aug. 3, 2020 Office Action issued in U.S. Appl. No. 16/123,604.
U.S. Appl. No. 16/123,604, filed Sep. 6, 2018 in the name of Fumitoshi Numata.
Jan. 26, 2021 Office Action issued in Japanese Patent Application No. 2017-175686.
Aug. 24, 2020 Office Action issued in Chinese Patent Application No. 201811045279.X.
Apr. 30, 2021 Office Action issued in Chinese Patent Application No. 201811045279.X.
Aug. 24, 2021 Office Action issued in Chinese Patent Application No. 201811045279.X.

\* cited by examiner

CONTROLLER AND POWER TOOL INCLUDING THE SAME

CROSS-REFERENCE

This application claims priority to Japanese patent application serial number 2018-117116, filed on Jun. 20, 2018, the contents of which are incorporated herein by reference in their entirety.

TECHNICAL FIELD

The present invention generally relates to a controller, which is included as part of a power tool, and helps to control said power tool.

BACKGROUND ART

Various controllers have been known and used widely for years as a means for controlling a power tool (for example, controllers have been known to be used for controlling the driving of a motor as the tool's drive source). The quantity of heat generated from such controllers has become large recently, due to a higher output of the motor. Consequently, a recent high-priority issue has been to cool the controllers of said electric power tools, wherein when such a controller gets heated in the tool housing, cooling is conducted in an efficient manner so as to discharge the heat outside the housing. Japanese Patent Laid-Open Patent Publication No. 2014-79812 discloses one such strategy for dealing with such a problem, where cooling air flows within the housing of the tool by rotating a cooling fan provided in a rotor shaft of the motor synchronously with the rotor shaft thereof.

However, according to the limited arrangement configurations of the electric elements in the housing of the electric power tool, it sometimes happens that cooling air introduced from the intake port of such a tool does not reach the controller in a sufficient manner, which causes a problem, where the controller may not be cooled in an efficient manner.

Thus, as a result of the mentioned deficiencies in the art, there is a need in such electric power tools to cool contained controller in an efficient manner, even if cooling air introduced from the intake port of said tools does not sufficiently reach the controller.

SUMMARY

One exemplary embodiment of the present disclosure provides a controller that controls a power tool. The controller comprises a controller case that houses an electric circuit board. An electric element that generates heat and/or is to be cooled on the electric circuit board contacts a thick wall portion of the controller case.

According to this embodiment, when heat is applied to the thick wall portion of the controller case from the electric element on the electric circuit board, the applied heat that is transferred from the electric element can be transferred to a general portion separate from the thick wall portion due to heat uniformity. In other words, the general portion can absorb the heat applied to the thick wall portion. As a result, even though outside air introduced from the intake port may not sufficiently reach the controller, it can still be cooled in an effective manner.

In another exemplary embodiment of the disclosure, the controller case includes a designated high temperature portion that rises in temperature due to contact of the electric element, and also includes a low temperature portion separate from the high temperature portion. Furthermore, the thick wall portion extends from the high temperature portion to the low temperature portion.

According to this embodiment, heat can be transferred from the high temperature portion to the low temperature portion through an extending intermediary member (for example, an extension portion) in a reliable manner. As a result, heat applied to the thick wall portion can be absorbed by the low temperature portion in a reliable manner, and serve to effectively dissipate the heat, and cool the controller in an efficient manner.

In another exemplary embodiment of the disclosure, the controller case is made of material with a thermal conductivity which is 120 to 200 W/mK.

According to this embodiment, through use of said material, heat conductivity of the controller case can be improved.

Another exemplary embodiment of the disclosure provides the controller described above included as part of a power tool. Furthermore, in this embodiment a high temperature portion of the controller, similar to the high temperature portion mentioned above, is connected to a low temperature portion of a power tool main body of the power tool through a heat pipe.

According to this embodiment, heat can be directly transferred from the high temperature portion of the controller to the low temperature portion of the power tool. As a result, the controller can be cooled in an efficient manner.

In another exemplary embodiment of the disclosure, the heat pipe contacts the electric element.

According to this embodiment, heat transfer can be directly employed from the heat generation source of the controller, to the power tool. As a result, the controller can be cooled in a further efficient manner.

In another exemplary embodiment of the disclosure, the heat pipe surface-contacts the electric element.

According to this embodiment, in comparison with a case where, for example, a line contact is employed, by contact of the pipe surface itself, the heat pipe can receive heat from the electric element in an efficient manner.

In another exemplary embodiment of the disclosure, the heat pipe that surface-contacts the electric element is covered with a cover that is screw-fixed to the controller case.

According to this embodiment, by screw-fixing the cover to the controller case, the surface-contact portion of the heat pipe can be pressed toward the electric member. As a result, a state where the surface-contact portion of the heat pipe surface-contacts the electric element can be firmly maintained (a close surface-contact can be employed). Thus, the heat pipe can receive heat from the electric element in an effective manner.

In another exemplary embodiment of the disclosure, the heat pipe is disposed along a thick wall portion of the controller case.

According to this embodiment, the thick wall portion can also serve as a protection for the heat pipe.

DETAILED DESCRIPTION

Figure 1:
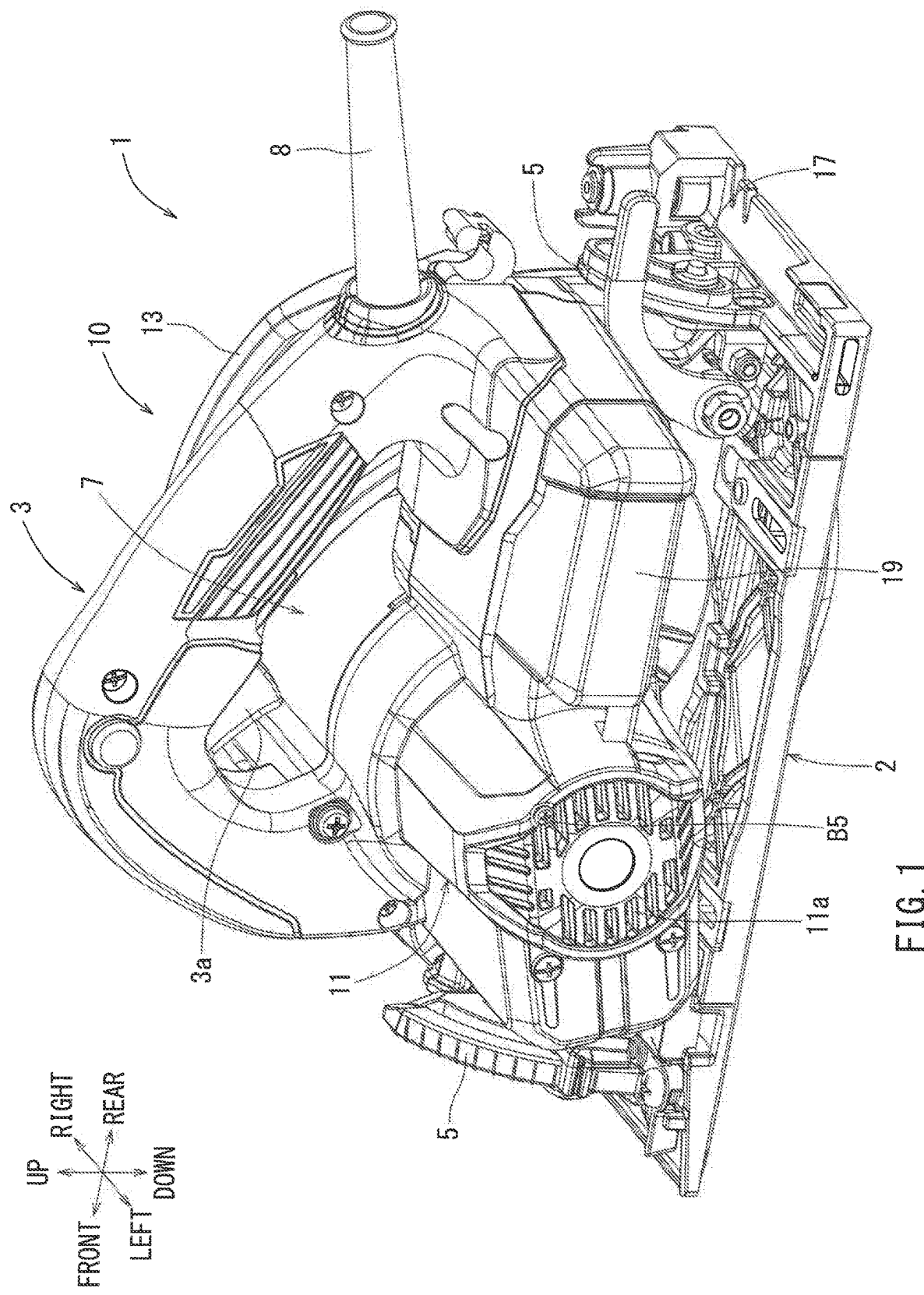
FIG. 1 is an overall perspective view of a portable circular saw according to an exemplary embodiment of the present disclosure.

The detailed description set forth below, when considered with the appended drawings, is intended to be a description of exemplary embodiments of the present invention and is not intended to be restrictive and/or to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, these specific details refer to well-known structures, components and/or devices that are shown in block diagram form in order to avoid obscuring significant aspects of the exemplary embodiments presented herein.

Representative, non-limiting embodiments according to the present disclosure will be described with reference to FIGS. 1 to 14. As an example of an electric power tool 1 embodied in the present disclosure, a so-called portable circular saw which may be used for cutting task performed by rotation of its circular cutting blade is shown in the figures. As shown in FIGS. 1 to 5, the electric power tool 1 of the present embodiment may include a base 2, a tool main body 10 that is supported on the upper surface of the base 2, a motor 20 serving as a drive source provided in the tool main body 10, a spindle 26 that is driven by a rotor shaft 21 of the motor 20, and a circular saw blade 12 that is attached to the spindle 26. As shown in the figures and explained below, a cutting/advancing direction (a direction in which the saw blade 12 cuts into a workpiece W) is referred to as a front side (the left side in FIG. 3 as seen when the figure is viewed, corresponding to the front side of the legend). A user (not shown) may be positioned at the rear of the electric power tool 1 (the right side in FIG. 3 as seen when the figure is viewed, corresponding to the rear side of the legend). The orientation of directions recited as up, down, left, right, front, and rear is relative, and is based on the user's position.

As shown in FIGS. 1 to 5, the electric power tool 1 may be provided with the circular saw blade 12 that rotates when the motor 20 that is discussed infra is driven. The saw blade 12 may be provided such that the cutting/advancing direction of the saw blade 12 is in the frontward direction. The upper half circumferential periphery of the saw blade 12 may be covered with a blade case 13. A void arrow (not shown) may be depicted on a lateral side of the blade case 13 showing a rotational direction of the saw blade 12 to the user (a clockwise direction in FIG. 3).

Figure 3:
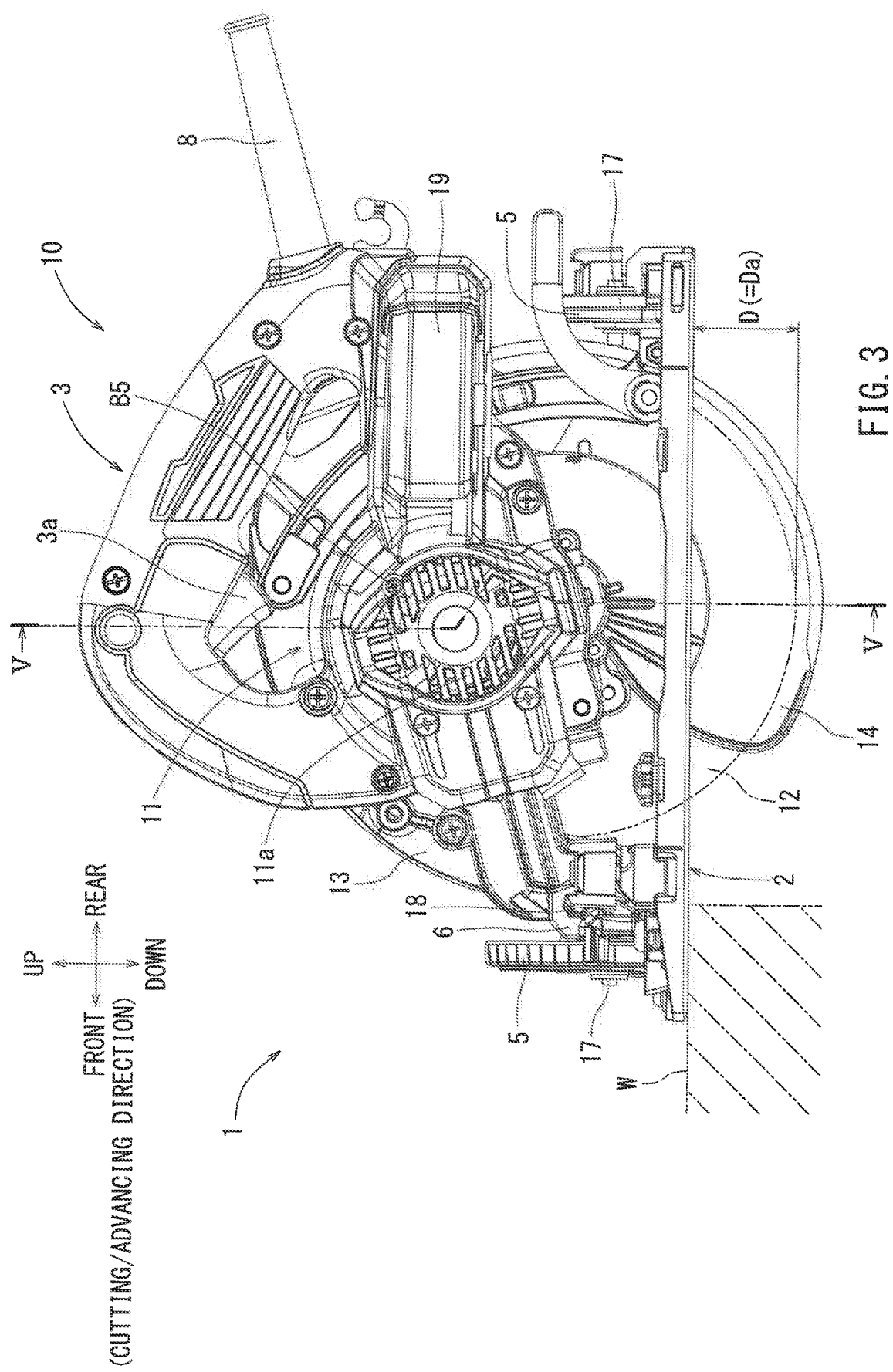
FIG. 3 is a left side view of the portable circular saw shown in FIG. 1.
Figure 4:
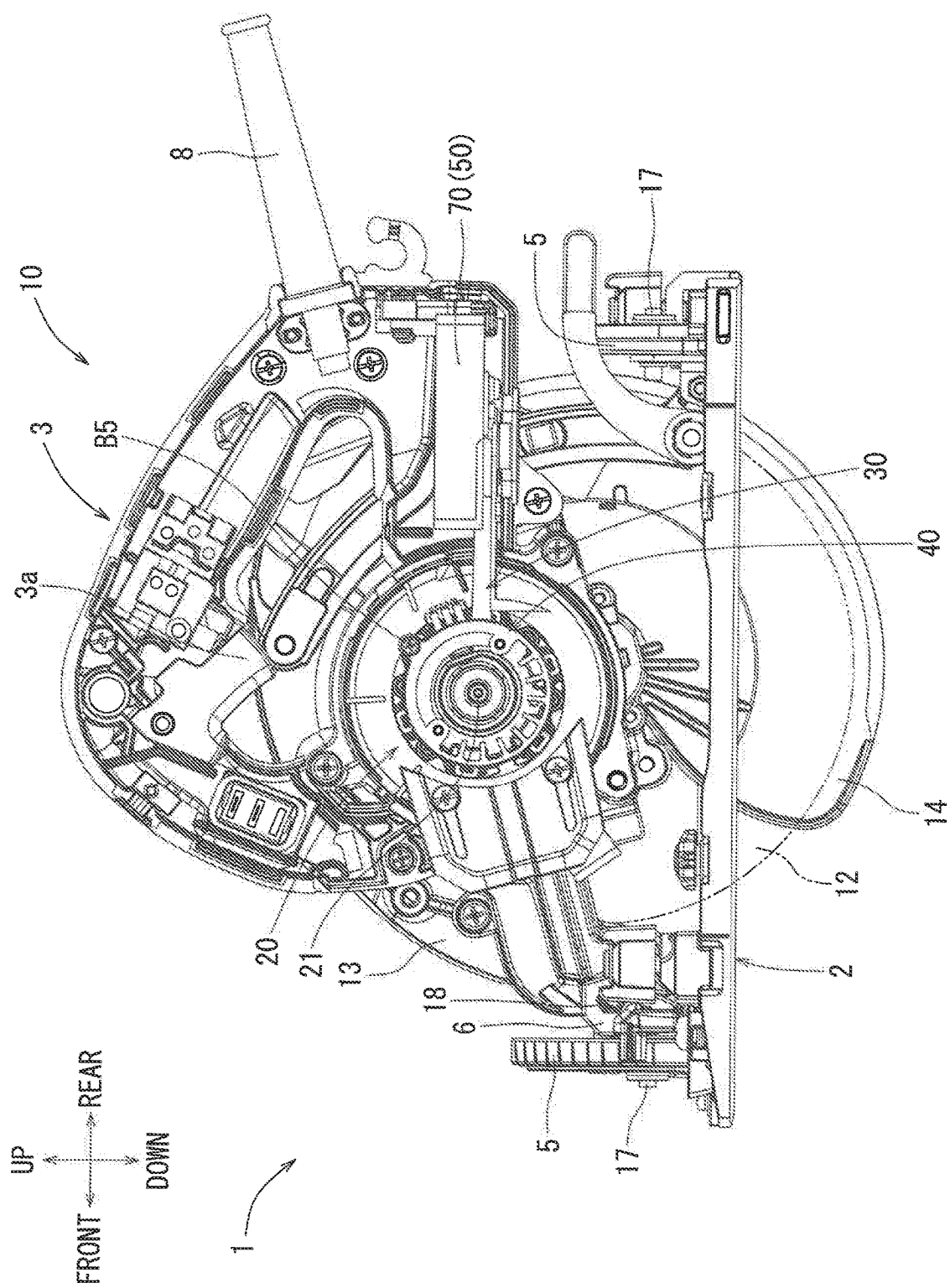
FIG. 4 is the portable circular saw showing a state where the motor housing is removed in FIG. 3.

The lower half circumferential periphery of the saw blade 12 may be at least partially exposed, and may protrude downwards from the base 2. This exposed, protruding portion of the saw blade 12 is able to cut into a desired material (workpiece W) to perform a cutting task. The lower half circumferential periphery of the saw blade 12 may also partially be covered by a movable cover 14 that can open/close in the circumferential peripheral direction of the saw blade 12, depending on its contact with the workpiece W. In particular, when a front end portion of the movable cover 14 is brought into contact with the workpiece W to move the electric power tool 1 forward in the front direction, the movable cover 14 may open upward in the counterclockwise direction as shown in FIG. 3, which exposes the saw blade 12 commensurately by the amount the movable cover 14 is opened, as the tool 1 moves forward and the movable cover 14 opens further. Subsequently, the cutting task can be performed by the exposed saw blade 12.

As shown in FIGS. 1 to 5, a gear case 7 may be provided integrally with a blade case 13 on the left side thereof. A reduction gear train 25 may be housed within the gear case 7. A motor housing 11 may be connected to the left side of the gear case 7. A handle 3 may be provided above a connection portion between the motor housing 11 and the gear case 7. The handle 3 may approximately have the shape of an upward facing D-shaped loop such that it roughly extends parallel to the front-to-rear direction and has a through hole in its interior in the left-to-right direction. A trigger-type switch lever 3a may be provided on the inner peripheral circumferential surface of the handle 3. When the user pulls the switch lever 3a upward, said pulling action may start the motor 30, and in turn rotate the saw blade 12. Conversely, when the user stops pulling the switch lever 3a, both the motor 30 and the saw blade 12 may stop. A power cord 8 for supplying electric power to the electric power tool 1 may be provided so as to extend from the rear end of the handle 8 in the rearward direction.

Figure 5:
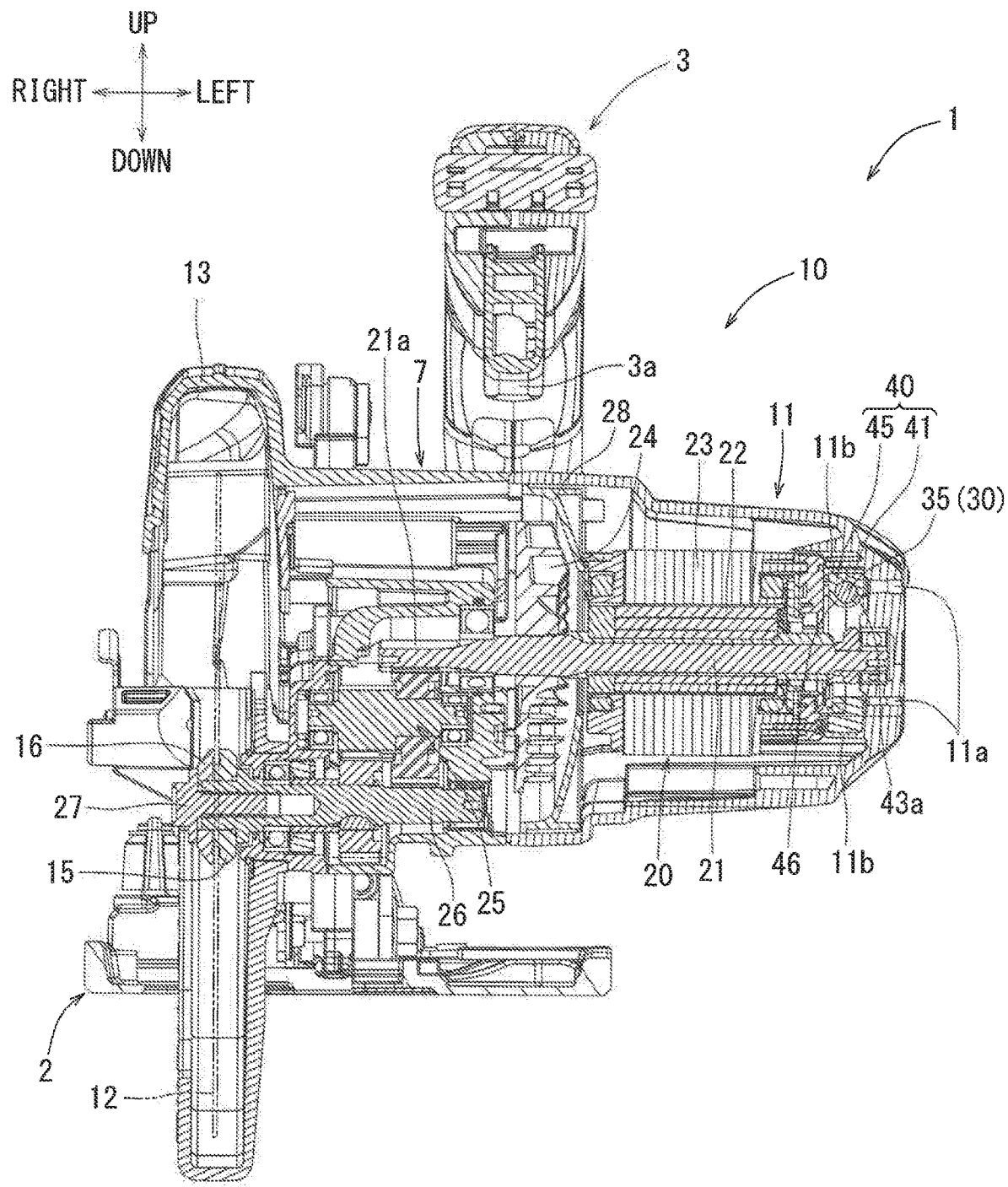
FIG. 5 is a cross-sectional view taken along line V-V of FIG. 3.
Figure 6:
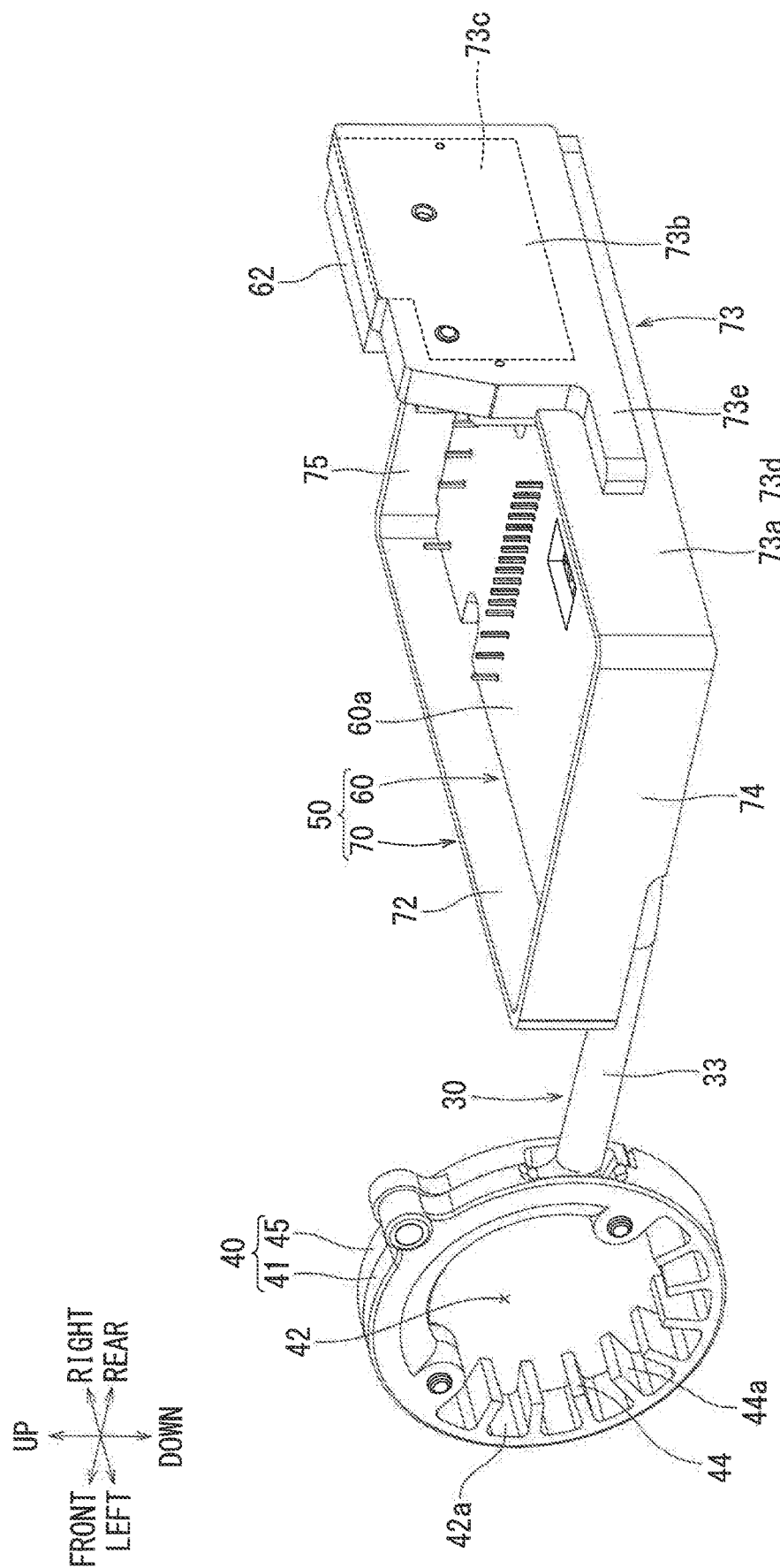
FIG. 6 is an enlarged view of a heat sink, a heat pipe, and a controller shown in FIG. 2.

As shown in FIG. 5, when the blade surface of the saw blade 12, which extends in the up-down and front-rear directional plane, is perpendicular to the base 2 extending in the front-rear and left-right directional plane, a so-called perpendicular cutting can be performed. However, in addition to said perpendicular configuration, the tool main body 10 of the electric power tool 1 may also be tilted in the left-to-right direction with respect to the base 2 around a left-to-right tilt shaft 17, which results in the blade surface also being tilted by the same amount. By tilting the tool main body 10 in the left-to-right direction, resulting in the tilting of the blade surface of the saw blade 12 in the left-to-right direction with respect to the base 2, a so-called oblique cutting can be performed.

As shown in FIGS. 1 to 4, an angular plate 5 may be provided integrally with the base 2 located extending upward from the front upper surface portion of the base 2. A tilt bracket 6 may be attached to the rear side of the angular plate 5. The tilt bracket 6 may be supported by the angular plate 5 via the left-to-right tilt shaft 17 such that it can also be tilted in the left-to-right direction along with shaft 17, by the same amount. A front end portion of the blade case 13 of the tool main body 10 may be attached to the tilt bracket 6 such that it is independently tiltable in the up-to-down direction via an up-to-down tilt shaft 18. Because of this configuration, the tool main body 10 may be separately tiltable with respect to the base 2 not only in the left-to-right direction but also in the up-to-down direction, by differing amounts in each direction. There may be a plurality of angular plates 5, where in addition one integral angular plate 5 being provided at the upper front surface portion of base 2 as described, another integral angular plate 5 may also be provided integrally with the base 2, extending upwards from the upper surface of the base 2, at the rear upper surface of the base 2. Because of this configuration, the tool main body 10 may be supported via the left-to-right tilt shaft 17 so as to be tiltable in the left-to-right direction, not only at the front of the base 2 but also at the rear of the base 2. Furthermore, with the up-to-down tilting feature, by changing the height of the tool main body 10 with respect to the base 2, a protruding length of the saw blade 12 protruding from the lower surface of the base 2 in the downward direction may be changed. Because of this configuration, a cutting depth D of the saw blade 12 with respect to the workpiece W can be adjusted. When the tool main body 10 is disposed at its lowest position relative to the base 2 via the up-to-down tilt shaft 18, the cutting depth D in this position may be the maximum cutting depth Da (refer to FIG. 3, showing the lowest position of tool main body 10).

As shown in FIG. 5, the motor 20 may be housed in the motor housing 11. A brushless motor operated by AC power (ACBL motor) may be used as the motor 20. The rotor shaft 21 of the motor 20 may extend in the left-to-right direction and be supported by the motor housing 11 in a rotatable manner, such that it can rotate about its longitudinal axis. A rotor 22 may be provided circumferentially around the rotor shaft 21 such that it rotates synchronously with the rotor shaft 21. A stator 23 may be fixed to the motor housing 11, wherein the inner peripheral radial surface of the stator 23 faces the outer peripheral radial surface of the rotor 22 in the radial direction of the rotor shaft 21, where inward and outward describe the radial direction relative to said shaft 21.

As shown in FIG. 5, a cooling fan 24 may be attached to the rotor shaft 21 on the right side of the rotor 22 and the stator 23 such that the cooling fan 24 is tightly circumferentially fitted around, and rotates synchronously with, the rotor shaft 21. The cooling fan 24 may be a centrifugal fan. A plurality of intake ports 11*a* may be provided on the left side of the motor housing 11. Furthermore, a plurality of exhaust ports (not shown) may be provided on the motor housing 11 circumferentially around the cooling fan 24. The cooling fan 24 may be covered with a baffle plate 28 both on the side of the intake ports 11*a* (the left side in FIG. 5 as seen when the figure is viewed) and on the side of the exhaust ports (outside the cooling fan 24 in the radial direction).

As shown in FIG. 5, a drive gear 21*a* may be provided at the right end of the rotor shaft 21. The spindle 26 may be rotatably supported below an extension of the axis of the rotor shaft 21, extending parallel to the rotor shaft 21 in the left-to-right direction. Rotation of the rotor shaft 21 may be reduced in two stages, via the drive gear 21 and the reduction gear train 25, respectively, and then transmitted to the spindle 26. A right end portion of the spindle 26 may protrude to such an extent in the right direction that it extends into the interior of the blade case 13. The saw blade 12 may be attached to said protruding portion of the spindle 26 within the blade case 13 such that it is firmly held between an inner flange 15, to the left of the blade 12, and an outer flange 16, to the right of the blade 12, in the left-to-right longitudinal axial direction of the spindle 26. The inner flange 15 and the outer flange 16 may be tightened to the spindle 26 by a bolt 27. Because of this configuration, the saw blade 12, which as described is supported in the left-to-right direction between the two flanges, may be supported such that it lies securely on, and rotates synchronously with, the spindle 26.

Figure 7:
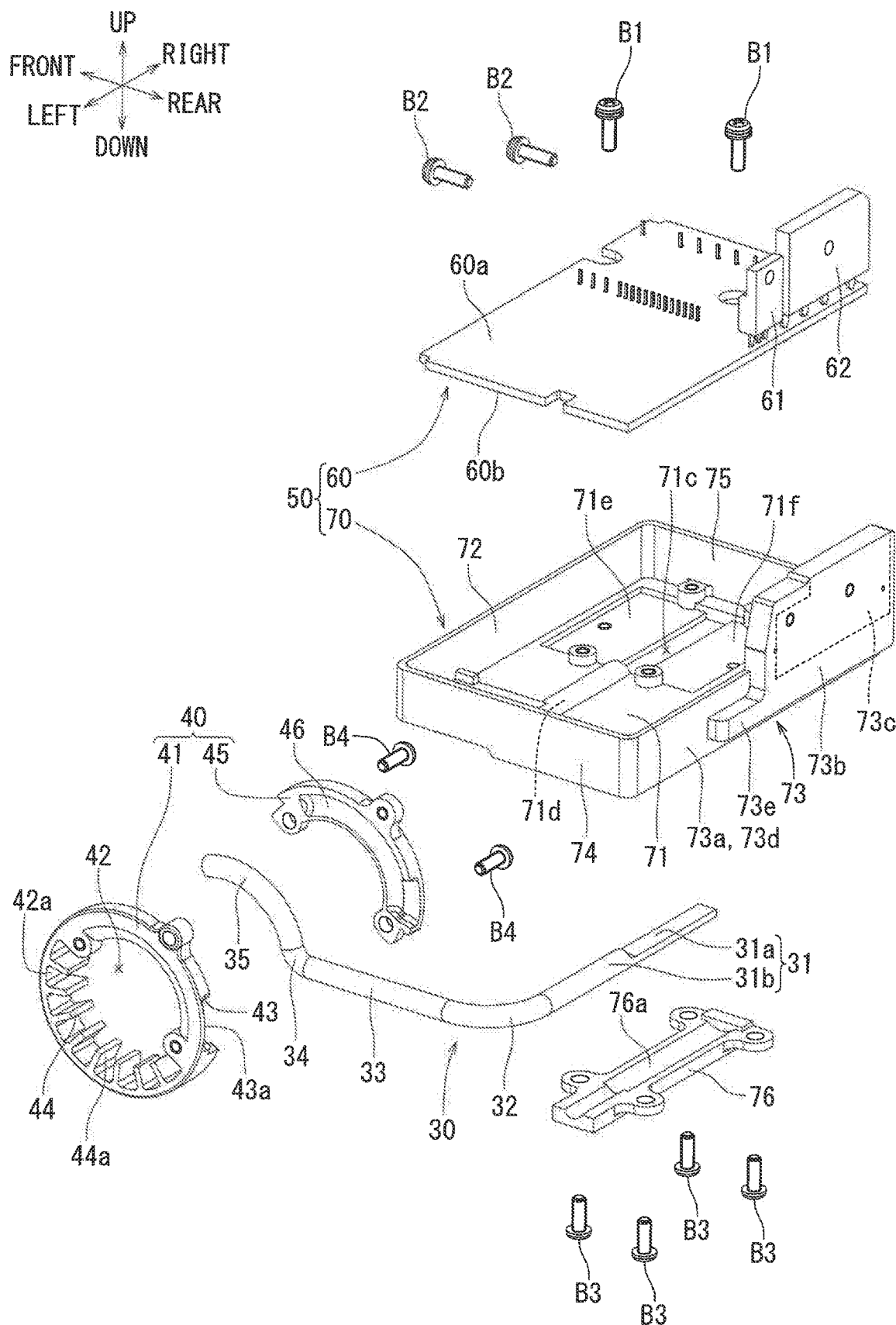
FIG. 7 is an exploded perspective view of FIG. 6.
Figure 8:
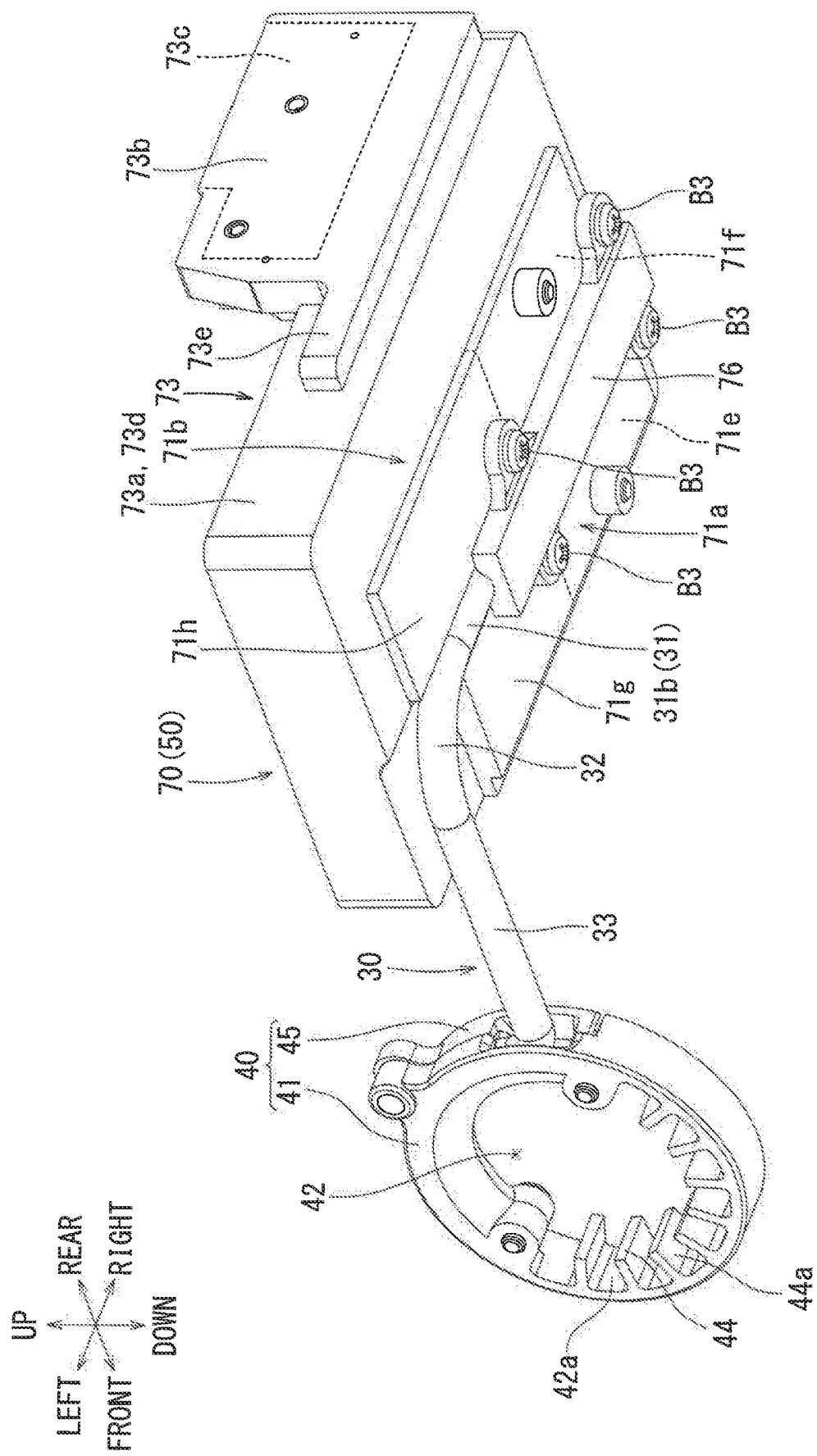
FIG. 8 is an enlarged view of the heat sink, the heat pipe, and the controller shown in FIG. 6 viewed from below.

A heat pipe 30 present in the proximity of the intake ports 11*a* may be a heat transport device made of copper. As shown in FIGS. 6 to 10, the heat pipe 30 may take the form of different shapes such as, for example, an approximately S-shape form as shown in FIG. 7, according to its arrangement position relative to the other components. In this embodiment, as shown in FIG. 7, the heat pipe 30 may be in a tubular shape and includes a first linear member 31 extending in the right-to-left direction, a second linear member 33 extending in the rear-to-front direction via a first bent portion 32 that is curved at an approximately right angle from a left end portion of the first linear member 31 toward a rear end portion of the second linear member 33, and a terminal circular arc member 35 that is curved upwards at an approximately right angle via a second bent portion 34 from a front portion of the second linear member 33 toward a point upwards and frontwards of said front portion.

As to the internal structure of the heat pipe 30, it is as follows. The heat pipe 30 may include an inner layer called a wick, which is provided with a plurality of nets, inside an outer layer made of copper. A liquid heat transport medium such as, for example, water may be sealed in the interior of the heat pipe 30. When one end of the heat pipe 30, i.e., the first linear member 31 (heated portion) receives heat, the heat transport medium (water) may evaporate. The evaporated heat transport medium (water) may move to the other end of the heat pipe 30, i.e., the circular arc member 35 (heat dissipation portion). The heat transport medium (water) that dissipates heat at the circular arc member 35 may liquefy. The liquefied heat transport medium (water) may then move back from the circular arc member 35 to the first linear member 31 by capillary action. By disposing the first linear member 31 below the circular arc member 35, the heat transport medium (water) that is evaporated and converted into vapor, moves upwards from the first linear member 31 to the circular arc member 35, thereby increasing the speed of the heat transportation.

Furthermore, conversely, by disposing the first linear member 31 below the circular arc member 35, the liquefied heat transport medium (water) may move downwards from the circular arc member 35 to the first linear member 31 automatically by the force of gravity, thereby also increasing the speed of the heat transportation. In other words, by disposing one end of the heat pipe 20 at a heat generation source and the other end of the heat pipe 20 at a heat dissipation source, and then disposing the heat generation source below the heat radiation source, a rapid and effective heat transport may be performed between the heat generation source and the heat dissipation source, in a bi-phase, bi-directional manner through the heat pipe 50, where the vapor phase travels upward and toward the front and the liquid phase travels downward and toward the rear. In the electric power tool 1 according to the present embodiment, the first linear member 31 may be attached to a controller 50 and the circular arc member 35 may be assembled to a heat sink 40. The first linear member 31 of the heat pipe 20 may be located at the heat generation source and the circular art member 35 may be located at the heat dissipation source. The controller 50 and the heat sink 40 will be discussed infra.

Furthermore, a right half portion of the first linear member 31 of the heat pipe 30 may be formed such that its upper side is formed as a lower hemispherical shape, with a flat upper surface. In more detail, as shown in FIG. 7, the right half portion of the first linear member 31 of the heat pipe 30 may have a plane portion 31a representing said flat upper surface, of the upward facing semicircular cross-section of the right half of the first linear member 31 in the front-rear left-right directional plane. In contrast, a left-half portion of the first linear member 31 of the heat pipe 30 may be a general portion 31b having a full circular tubular shape without the forming of the plane portion 31a. High heat conductive grease (for example, THERMAL JOINT (product name) made by KATAOKA SENNZAI CO., LTD.) may be applied to the first linear member 31 and the circular arc member 35 of the heat pipe 30. By applying this heat conductive grease to the heat pipe 30, a heat insulation layer such as air etc. with respect to mated members that are connected to the heat pipe 30 can be reduced and/or eliminated. The mated members may be a heat sink 40, an IPM (Integrated Power Module) 63, a bottom wall 71 of a controller case 70, and a cover 76 etc., which are discussed infra. Because of this application of grease, contact thermal resistance generated between the heat pipe 30 and the mated members can be suppressed, thereby improving heat transport effect (heat soaking effect) of the heat pipe 30.

Next, referring to FIGS. 6 to 10, the heat sink 40 will be explained in detail. The heat sink 40 may include a heat sink main body 41 and a cover member 45, both of which are made of aluminum. The heat sink main body 41 may be formed in an annular shape having an interior hole 42 extending in the left-to-right direction. The cover member 45 may cover a cutout 43 that is formed extending rightward from the circumferential periphery of the heat sink main body 41. A plurality of fins 44 may be formed on the inner peripheral circumferential boundary of the interior hole 42 of the heat sink main body 41. The plurality of fins 44 may be formed such that each fin surface 44a of the fins 44 extends radially inwards toward the longitudinal direction of the rotor shaft 21 of the motor 20. Furthermore, a recess groove 43a may be formed on an inner surface of the cutout 43 of the heat sink main body 41, having a semicircular cross section, facing rightward in the up-down front-rear directional plane, may form a complementary-fit configuration with the left half portion of the circular arc member 35 of the heat pipe 30.

Furthermore, a recess groove 46 having a semicircular cross section facing leftward in the up-down front-rear directional plane, into which the right half portion of the circular arc portion 35 of the heat pipe 30 may complementarily fit, may be formed on an inner surface of the cover member 45. Because of this configuration, the circular arc member 35 of the heat pipe 30 may be inserted into both the recess grooves 43a and 46. The circular arc member 35 of the heat pipe 30 may be firmly secured in the left-to-right direction between the heat sink 41 and the cover member 45 without needing to increase the thickness of the heat sink 40. In the heat sink 40, the plurality of fins 44 may be formed extending radially inward over approximately half of the entire circumference of the heat sink main body 41. Furthermore, the recess groove 43a (a connection area of the heat pipe 30) may be formed over approximately another half of the entire circumference of the heat sink main body 41.

Next, referring to FIGS. 6 to 10, the controller 50 will be explained below. The controller 50 may generally include a rectangular electric circuit board 60 and a rectangular box-shaped controller case 70 that houses the electric circuit board 60. A control circuit including the IPM 63 that includes a microprocessor for controlling driving of the motor 20, an FET 61 for switching current of the motor 20, and a drive circuit including a diode bridge 62, among other components, may be mounted on the electric circuit board 60. As shown in FIG. 7, the FET 61 and the diode bridge 62 may be mounted along the edge of the electric circuit board 60 on the rear right corner of the electric circuit board's upper surface 60a.

Figure 9:
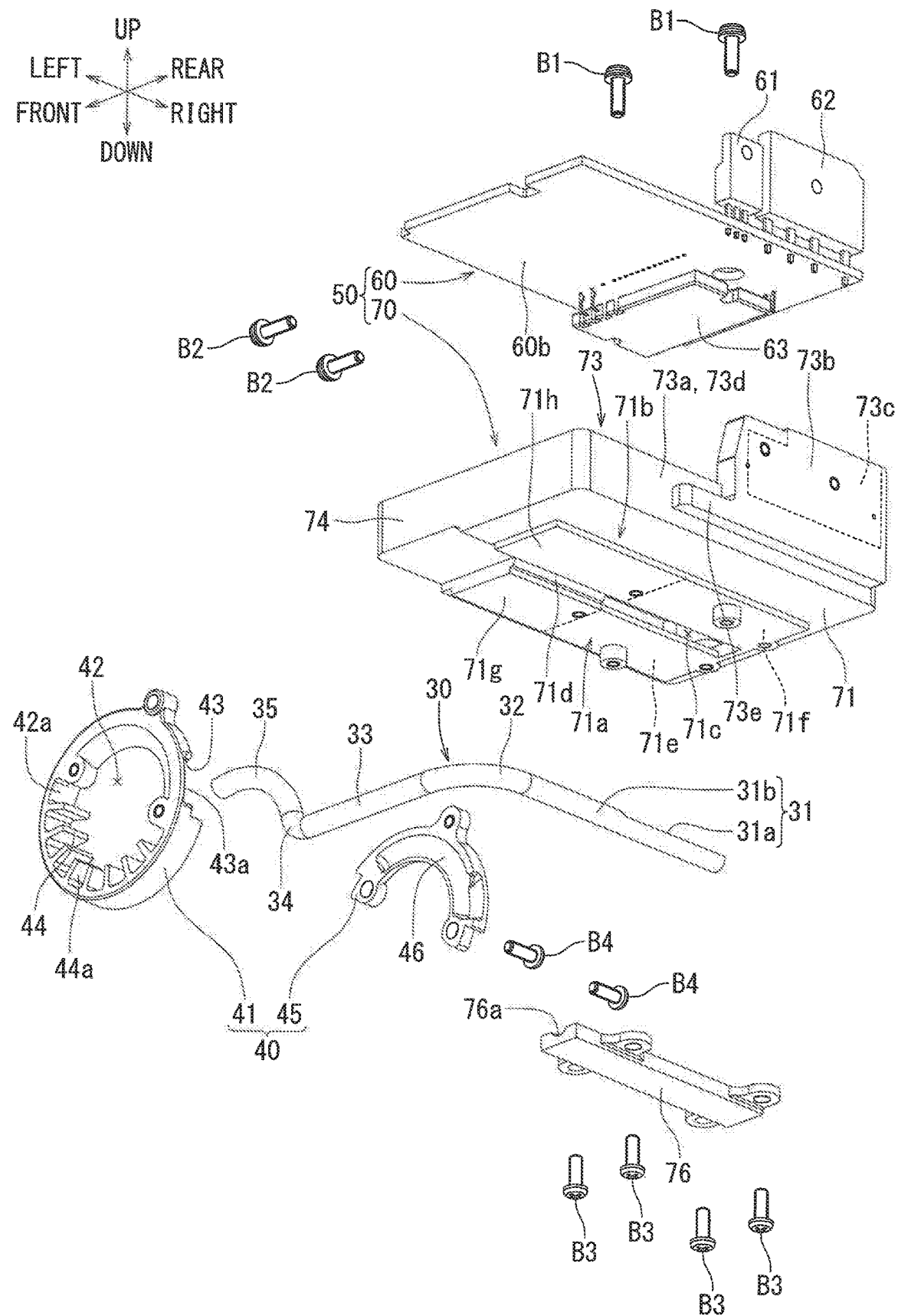
FIG. 9 is an exploded perspective view of FIG. 8.
Figure 10:
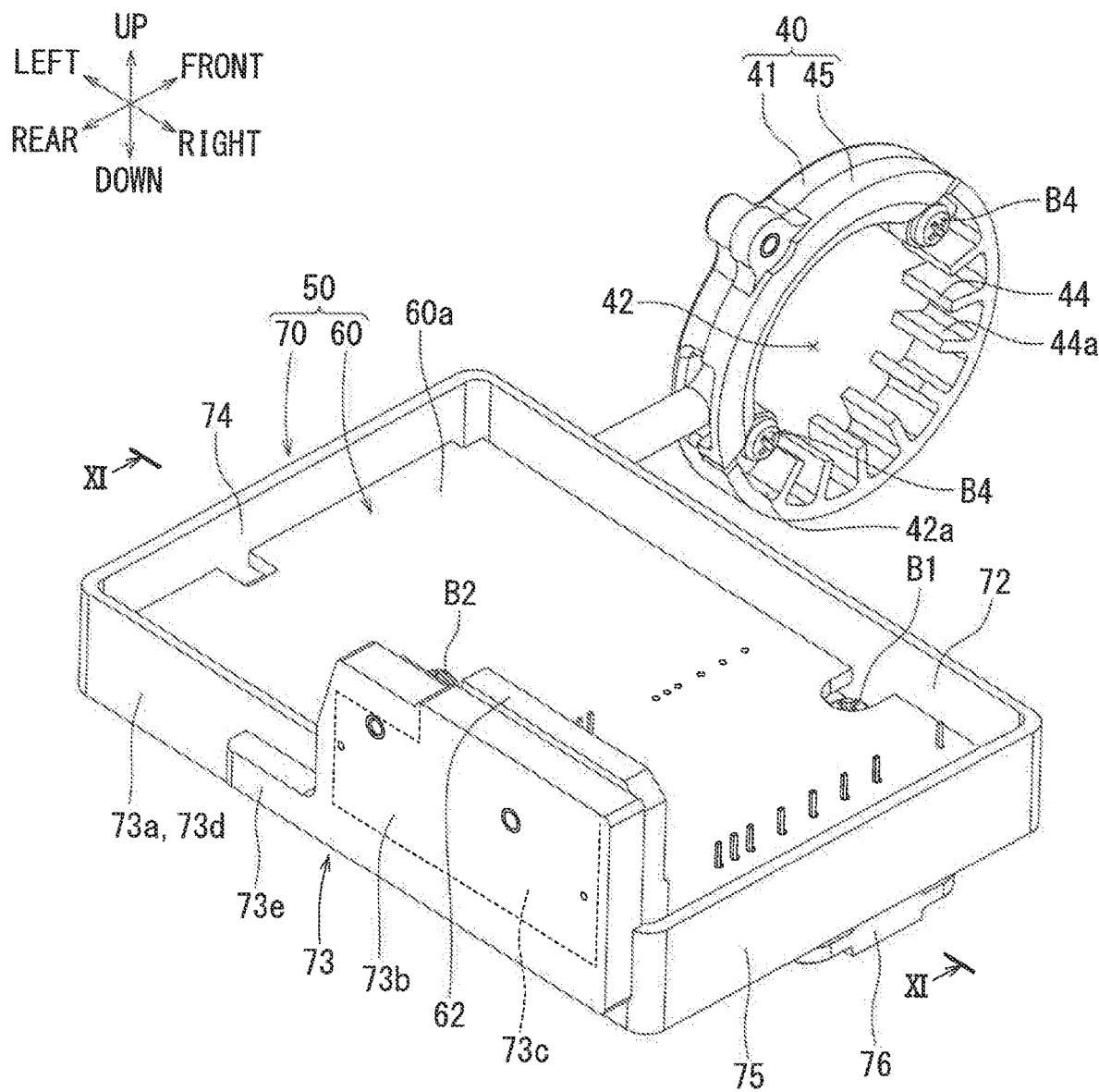
FIG. 10 is an enlarged view of the heat sink, the heat pipe, and the controller shown in FIG. 6 viewed from an upper right.

The FET 61 and the diode bridge 62 are heat-generating components, and through their operation in the control circuit, may generate heat by themselves. Consequently, the electric circuit board 60, and thus the controller 50 may also generate heat. Furthermore, as shown in FIG. 9, the IPM 63 may be mounted to the bottom of the electric circuit board 60, on the front right side of the board's underside surface 60b. The IPM 63 may not generate heat to a large extent. However, because its heat resistant temperature is low, it may also be necessary to cool the IPM 63. The electric circuit board 60 may be configured as described above.

The controller case 70 may be formed in a rectangular box shape having a bottom wall 71, a front wall 72, a rear wall 73, a left wall 74, and a right wall 75. A front projection portion 71a of the case 70 may be formed in a raised manner on the front side of the outer surface of the bottom wall 71 (refer to FIGS. 8 and 9). Furthermore, a rear projection portion 71b may be formed in a raised manner on the rear side of the outer surface of the bottom wall 71. A rectangular space 71c in between the front projection portion 71a and the rear projection portion 71b in the front-to-rear direction, which extends upward through the entirety of the bottom wall 71, may be formed on the right side of the said wall 71. Furthermore, a groove portion 71d having a semicircular cross section in the front-rear up-down directional plane, facing downward, may be formed on the left side, underside surface of the bottom wall 71, aligned with the space 71c in the right-to-left direction, between the front projection portion 71a and the rear projection portion 71b (refer to FIGS. 7 and 9).

Furthermore, a downwardly recessed portion 71e may be formed on the front right side of the inner surface of the bottom wall 71 (refer to FIG. 7). Also, a recessed portion 71f may be formed on the rear right side of the inner surface of the bottom wall 71. Because of this configuration, since as shown in the exploded view in FIG. 9 the position of the IPM 63 corresponds to the space above the recessed portions 71f and 71e, with empty space 71c in between, the IPM 63 may be disposed within the downwardly recessed region formed by said recessed portions 71f and 71e, and may lie below a general surface of the bottom wall 71. As described above, the recessed portion 71e may be formed only on the front right side of the inner surface of the bottom wall 71. Because of this configuration, the front left side of the bottom wall 71 may be a thick wall portion 71g (refer to FIG. 9). Furthermore, as described above, the recessed portion 71f may be formed only on the rear right side of the inner surface of the bottom wall 71. Because of this configuration, the rear left side of the bottom wall 71 may be a thick wall portion 71h. Thus, the groove portion 71d may be formed along the thick wall portions 71g and 71h. Consequently, the general portion 31b of the heat pipe 30, which is discussed infra, may fit complementarily into the downward facing semicircular groove formed by the groove portion 71d, and would thus be disposed between the thick wall portions 71g and 71h (refer to FIG. 8).

Furthermore, the right side of the rear wall 73 may abut heat dissipation members (not shown; for example, heat radiation plates) of the FET 61 and the diode bridge 62 mounted on the electric circuit board 60 as discussed infra.

Thus, the right side of the rear wall 73 may become a high temperature portion 73c caused by dissipating heat generated by the FET 61 and the diode bridge 62 (refer to FIGS. 6-9). In contrast, a remaining portion of the rear wall 73, aside from the high temperature portion 73c may not abut the FET 61 and the diode bridge 62, and thus this region may delineate a low temperature portion 73d that is not affected by the heat generated by the FET 61 and the diode bridge 62. The rear wall 73 may be configured such that a general portion 73a with general thickness corresponds to the low temperature portion 73d and a substantially thick(er) wall portion 73b corresponds to the high temperature portion 73c. For example, the general portion 73a may be approximately 1 to 3 mm in thickness and the thick wall portion 73b may be approximately 3 to 5 mm in thickness.

The thick wall portion 73b may extend by an extension portion 73e from the high temperature portion 73c to the low temperature portion 73d of the rear wall 73. When heat generated by the FET 61 and the diode bridge 62 is applied to the thick wall portion 73b, the applied heat dissipates to the general portion 73a due to heat uniformity across the length of the extension portion 73e. In other words, heat applied to the thick wall portion 73b may be absorbed and dissipated across the general portion 73a. The controller 70 may be made of aluminum alloy (for example, HT-1 (a product name) made by YAMAZAKI DIECAST CO., LTD.) Because aluminum alloy has excellent moldability and castability, the controller 70 may be formed in a desired shape and also reduction in weight may be obtained. Thermal conductivity of aluminum alloy is 169 to 178 W/mK. The controller case 70 may be configured as described above.

The electric circuit board 60 may be assembled to the controller case 70 by use of two first screws B1 (refer to FIGS. 7 and 9). By using the first screws B1, the electric circuit board 60 housed in the controller case 70 may be securely retained. When the electric circuit board 60 is mounted to the controller case 70 in such a manner, the heat radiation members of the FET 61 and the diode bridge 62 mounted on the electric circuit board 60 may contact the thick wall portion 73b of the rear wall 73 of the controller case 70. Furthermore, the heat radiation members of the FET 61 and the diode bridge 62 may be firmly affixed to the thick wall portion 73b of the rear wall 73 of the controller case 70 by second screws B2. Because of this configuration, each of the heat radiation members of the FET 61 and the diode bridge 62 may be firmly held in a state where they contact the thick wall portion 73b of the rear wall 73 of the controller case 70. Furthermore, a heat dissipation member (not shown; for example a heat radiation plate) of the IPM 63 mounted on the controller case 70 may contact the recessed portions 71e and 71f of the bottom wall 71 of the controller case 70. The controller 50 may be configured as described above.

Figure 11:
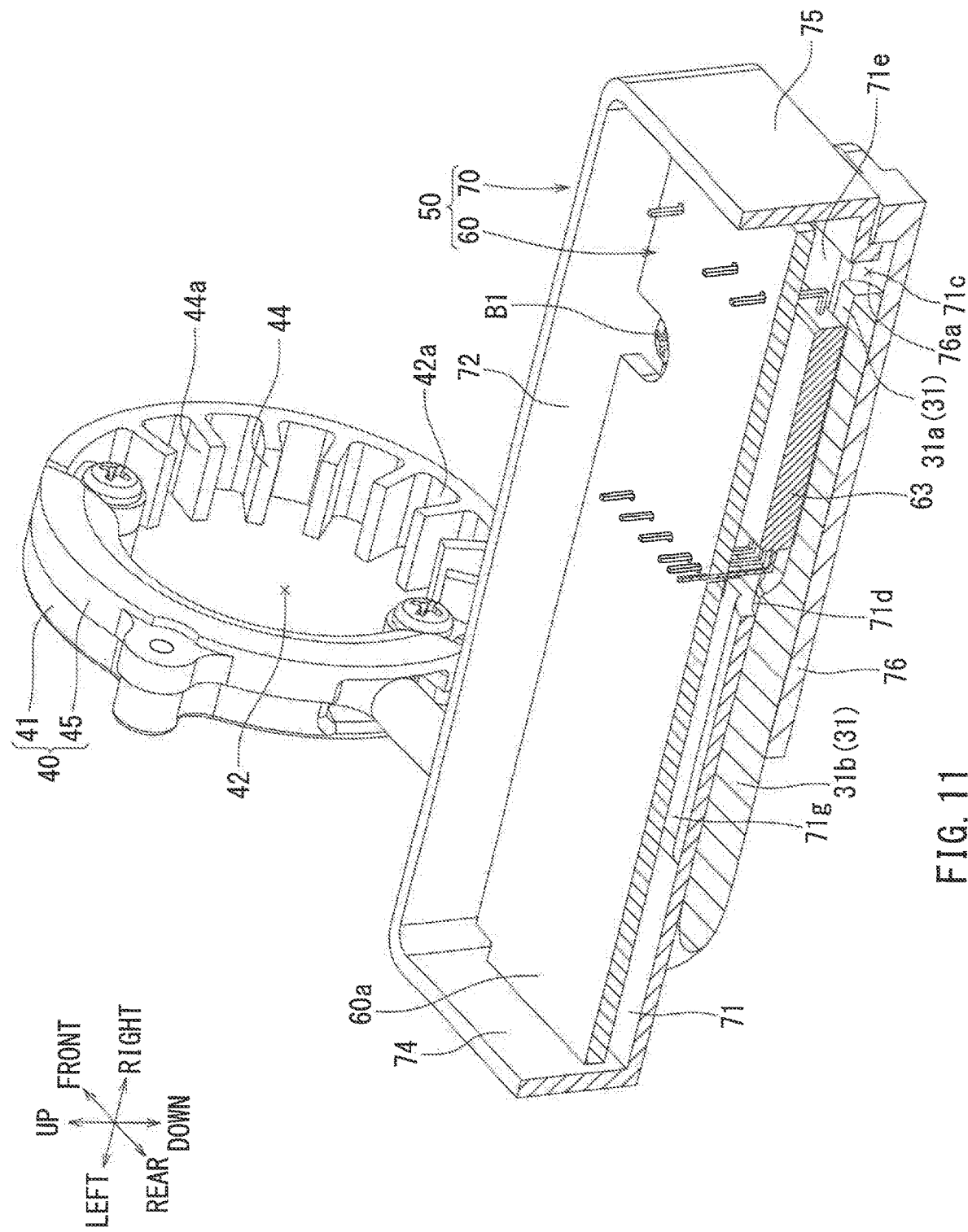
FIG. 11 is a cross-sectional view taken along line XI-XI of FIG. 10.
Figure 12:
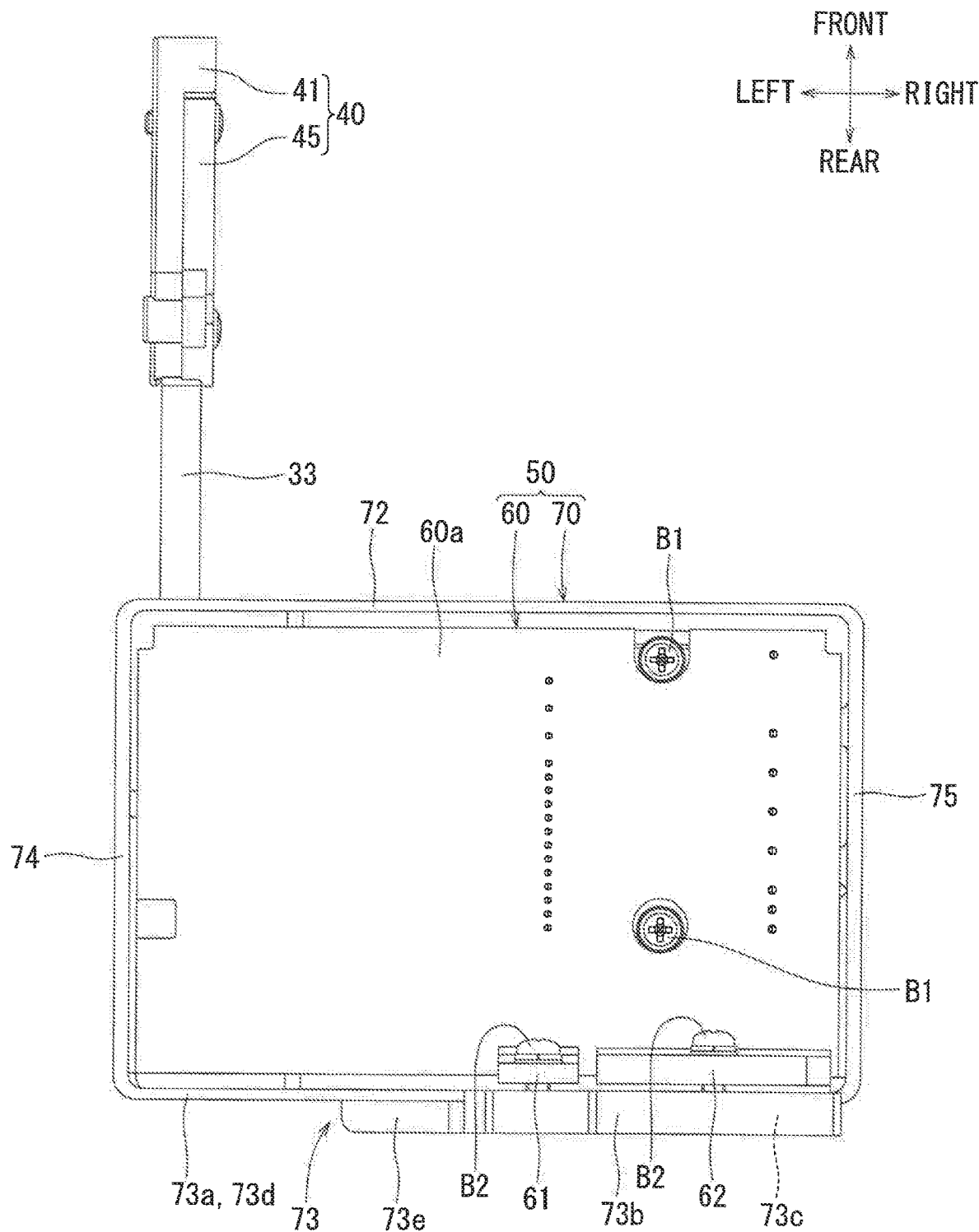
FIG. 12 is a plan view of FIG. 6.
Figure 13:
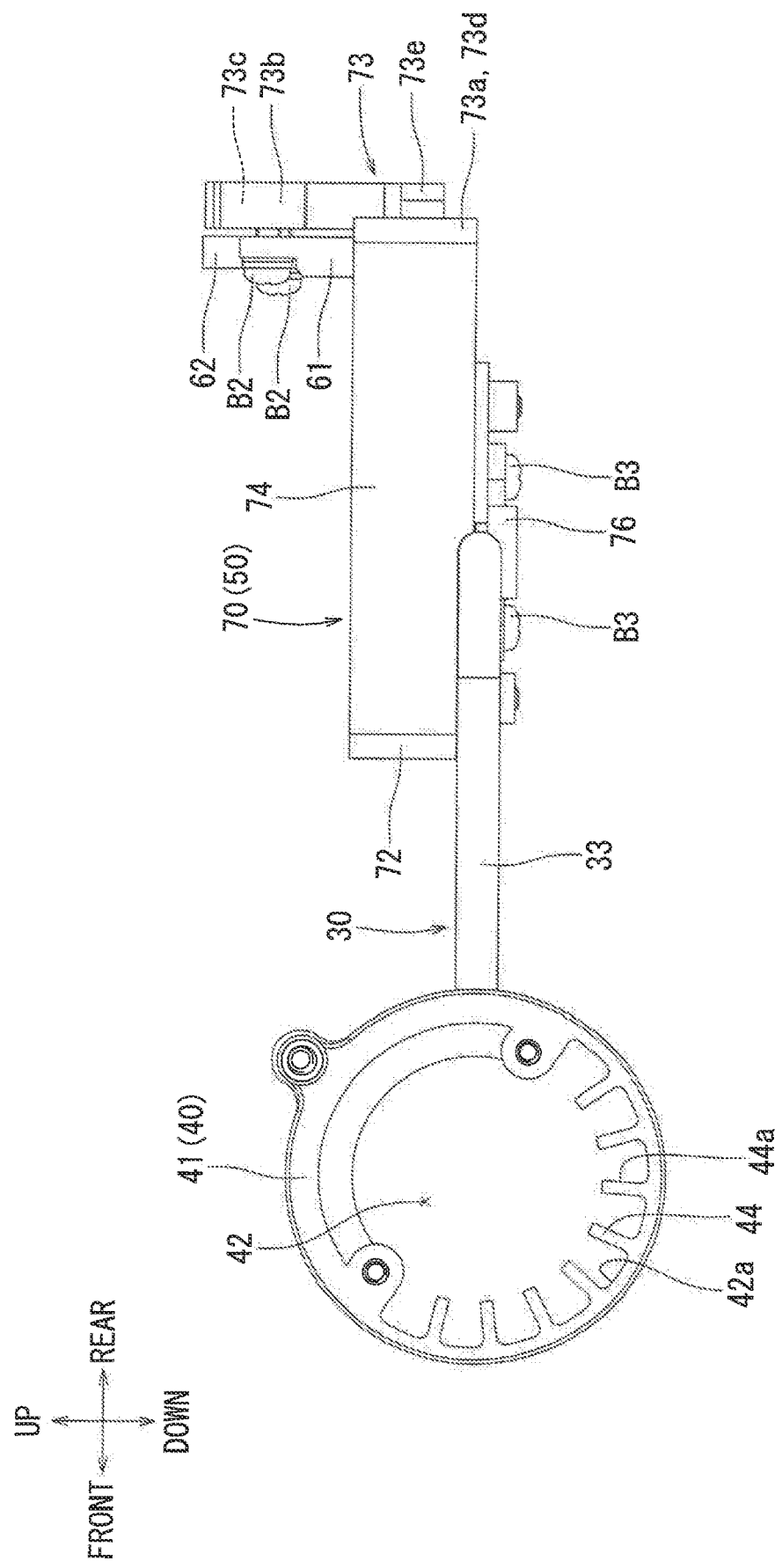
FIG. 13 is a left side view of FIG. 6.
Figure 14:
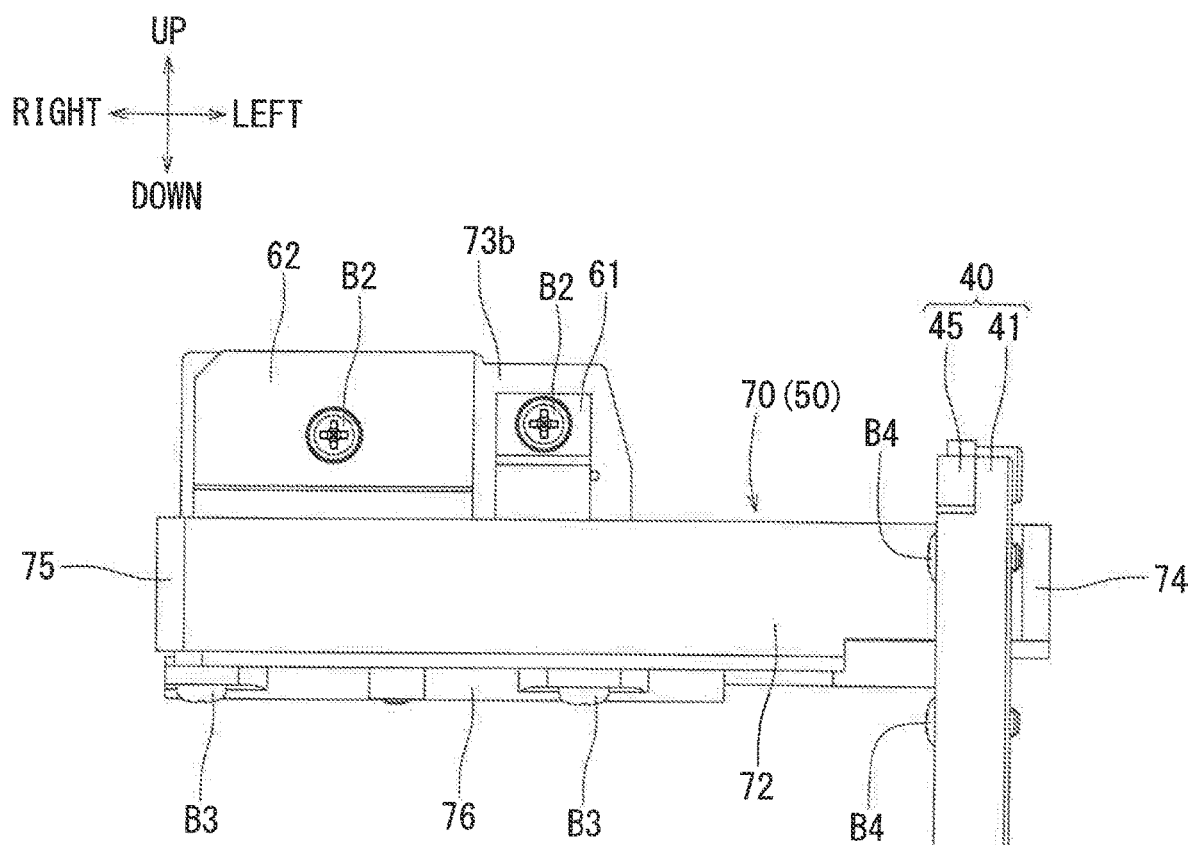
FIG. 14 is a front view of FIG. 6.

The first linear member 31 of the heat pipe 30 may be connected to the controller 50 (refer to FIGS. 6 to 14). This connection can be performed such that the first linear member 31 of the heat pipe 30 is held vertically between the bottom wall 71 of the controller case 70 and the semicircular upward-facing cover 76, and then to secure this attachment and affix the linear member 31 of the heat pipe 30 to the case 70, four corners of the cover 76 are fixed to the underside of bottom wall 71 of the controller case 70 by use of four third screws B3 (refer to FIGS. 7 and 9). In other words, the upper flat plane portion 31a of the first linear member 31 of the heat pipe 30 that surface-contacts the IPM 63 may be covered on its bottom by the cover 76 that is fixed to the controller case 70 by the third screws B3. As shown in FIG. 11, the flat upper surface plane portion 31a of the first linear member 31 of the heat pipe 30 may be held in a manner where its upper surface abuts and/or in contact with the lower basal surface of the IPM 63 mounted on the electric circuit board 60, via the space 71c. Similarly to the controller 70, the cover 76 may be made of aluminum alloy. Thus, the cover 76 can be formed in a desired shape because of its excellent moldability and castability, and also reduction in weight may be obtained.

Furthermore, the general portion 31b of the first linear member 31 of the heat pipe 30, which is held between the bottom wall 71 and the cover 76, may be inserted vertically between the recessed portion 71d of the bottom wall 71 having a semicircular cross section facing downward as seen in FIG. 7, and the recessed portion 76a of the cover 76 having a semicircular cross section facing upward. Because of this configuration, the first linear member 31 of the heat pipe 30 may be held between the controller 50 and the cover 76 without needing to increase the thickness of the connection portion. As described above, the heat pipe 30 thus abutting and/or surface-contacting the bottom basal surface of the IPM 63 may be covered by the cover 76 fixed to the controller case 70 by four third screws B3. In this way, the first linear member 31 of the heat pipe 30 may be connected to the controller 50.

The circular arc member 35 of the heat pipe 30 may be connected to the heat sink 40. This connection can be performed such that the circular arc member 35 of the heat pipe 30 is held in the front-to-rear direction between the rightward facing semicircular groove 43a of the heat sink main body 41 of the heat sink 40 and the leftward facing semicircular groove 46 of the cover member 45, and then both corners of the cover member 45 are fixed to the heat sink main body 41 of the heat sink 40 by use of two fourth screws B4. In this way, the cover member 45 can be fixed to the heat sink main body 41 by two fourth screws B4 without generating a gap. When the circular arc member 35 of the heat pipe 30 is connected to the heat sink 40 in this manner, the heat sink main body 41 of the heat sink 40 may be temporarily pre-fixed to the motor housing 11.

Because of the configuration of circular arc member 35 as described, said member of the heat pipe 30 can be held between the heat sink main body 41 and the cover member 45 without needing to increase the thickness of the connection portion. In this way, the circular arc member 35 of the heat pipe 30 may be connected to the heat sink 40. In other words, the IPM 63 mounted on the electric circuit board 60 of the controller 50 may be connected to the heat sink 40 through the heat pipe 30. The IPM 63 may not generate heat to a large extent, but it still may be necessary to cool the IPM 63. Because of this, the IPM 63 may correspond to the high temperature portion of the controller 50. The heat sink 40 may be cooled by outside air as discussed infra. Because of this cooling action, the heat sink 40 may correspond to the low temperature portion of the tool main body 10.

As described above, the heat sink 40 may be formed in an annular shape having the interior hole 42. Because of this configuration, the heat sink 40 may be housed and assembled in the motor housing 11 that houses the motor 20 by use of a fifth screw B5 such that an anti-load side of the rotor shaft 21 of the motor 20 penetrates (passes through) the radial interior of the interior hole 42, where said hole forms the radial interior of heat sink 40 (refer to FIGS. 1 to 2, FIG. 5). The heat sink 40 housed in the motor housing 11 may be securely held and positioned in a circumferential direction by a plurality of ribs 11b projecting from an inner surface of the motor housing 11. Because of this configuration, though the heat sink 40 is assembled only by the fifth screw B5, the heat sink 40 may be housed in the motor housing 11 without rattling. In this way, the heat sink 40 may be disposed around the anti-load side of the rotor shaft 21 of the motor 20. In other words, the heat sink 40 may be disposed between the motor 20 and the intake port 11*a* of the motor housing 11 in the right-to-left direction.

Figure 2:
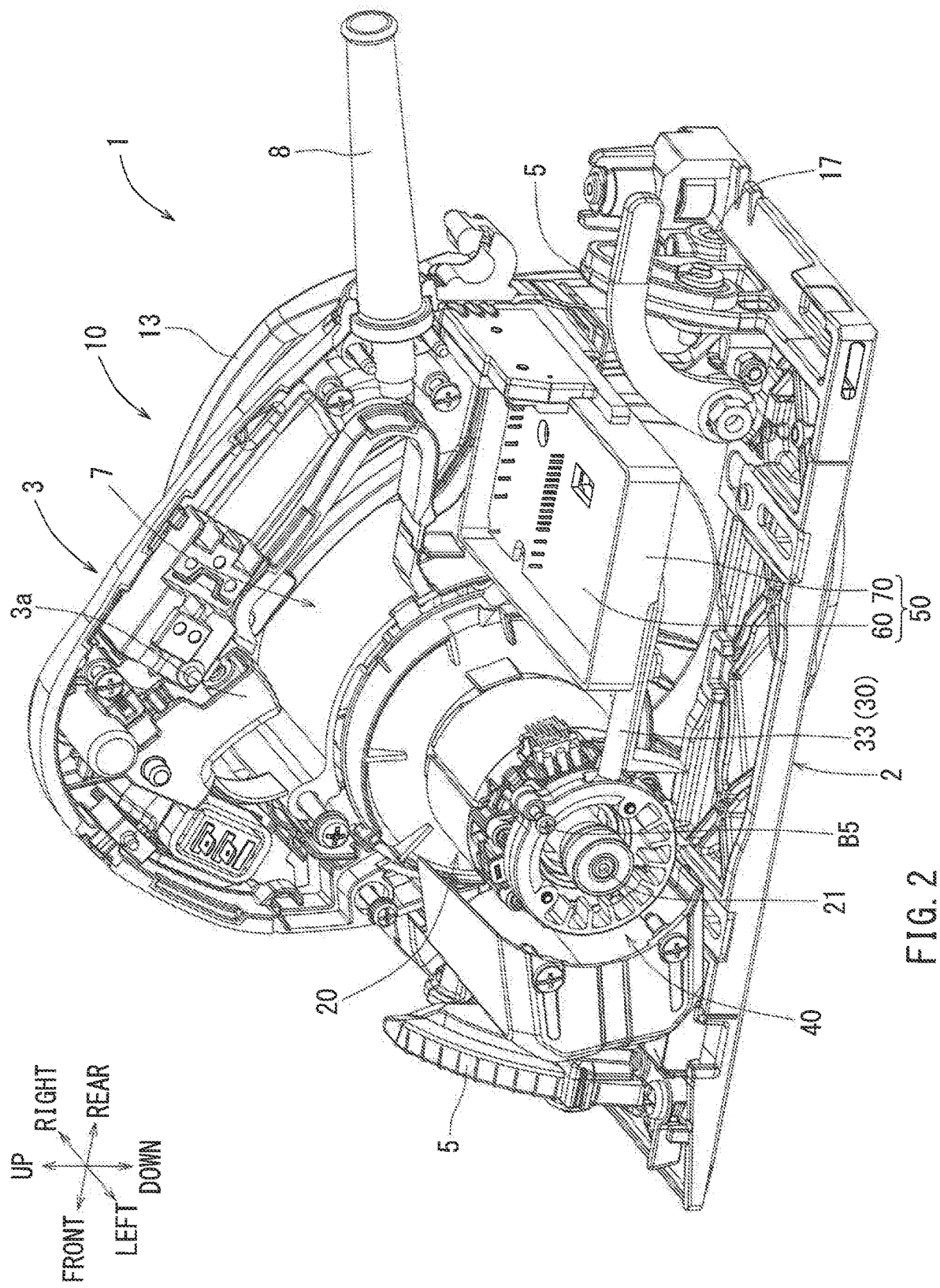
FIG. 2 is the portable circular saw showing a state where a motor housing is removed in FIG. 1.

As shown in FIGS. 1 and 2, the controller 50 may be housed in a contained controller housing case 19 that is provided at the rear of the motor housing 11. The controller housing case 19 may have enough space to house the entirety of the controller 50, extending behind the motor 20 to a large extent. An interior of the controller housing case 19 may communicate with an interior of the motor housing 11 through an opening (not shown) that is large enough to pass through at least the heat pipe 30 and electric wires (not shown) connected to the electric circuit board 60. When a cutting task is performed in a state where the tool main body 10 is positioned such that the cutting depth D of the saw blade 12 becomes the maximum cutting depth Da as shown in FIG. 3, the first linear member 31 (heated portion) of the heat pipe 30 may be disposed in a position so as to be lower than the circular arc member 35 (heat dissipation portion) of the heat pipe 30. Because of this configuration, when the tool main body 10 is operated at the maximum cutting depth Da, heat transfer from the heated portion (the first linear member 31) to the heat dissipation portion (the circular arc member 35) may be performed by the heat pipe 30, through evaporation, in a rapid and efficient manner.

Though not shown in the figures, when the tool main body 10 is moved upwards such that the cutting depth D of the saw blade 12 is reduced to about approximately 50% of the maximum cutting depth Da, the first linear member 31 (heated portion) may be at the same height of the circular arc member 35 (heat dissipation portion). In other words, when the user generally uses the electric power tool 1 in such a manner that the cutting depth of the saw blade 12 is disposed in a range from a position where it becomes the maximum cutting depth Da as shown in FIG. 3 to a position where it becomes approximately 50% of the maximum cutting depth Da, a heat-transfer state may be maintained, where heat transfer from the first linear member 31 to the circular arc member 35 is performed in a rapid and efficient manner.

Next, a flow of the cooling air in the interior of the motor housing 11 and a procedure to cool the controller 50 will be explained below. As shown in FIG. 5, the outside air (cooling air), which is introduced from the intake port 11*a* into the interior of the motor housing 11 by synchronous rotation of the cooling fan 24 with the rotor shaft 21 of the motor 20 upon which it is fitted circumferentially around, may cool the heat sink 40. Subsequently, the outside air that has entered into the motor housing 11 may flow from the left side to the right side of the motor 20 along the rotor shaft 21 to cool the motor 20. Then, the outside air (cooling air) may flow along the baffle plate 28 to be discharged to the outside through the exhaust port (not shown). Because of this airflow path, the outside air (cooling air) may not reach the controller 50 in a sufficient manner.

The first linear member 31 (heated portion) of the heat pipe 30 that abuts the lower basal surface of the controller 50 as described, may as a result receive heat from the controller 50, and the heat transport medium (water) in the interior of the heat pipe 30 may evaporate from the linear member 31 end of the heat pipe 30 to move toward the other circular arc member 35 end (heat dissipation portion) of the heat pipe 30 that is connected to the heat sink 40. Conversely, in the circular arc member 35 (heat dissipation portion) of the heat pipe 30 that is connected to the heat sink 40, the heat transport medium (water) may liquefy when the heat sink 40 is cooled by the outside air (cooling air) (because of the heat exchange between the outside air and the heat sink 40). Because of this liquefaction configuration, the liquefied heat transport medium (water) may move from the circular arc member 35 (heat dissipation portion) to the first linear member 31 (heated portion) via gravitational flow. As a result, heat transfer may be performed from the controller 50 to the heat sink 40, thereby cooling the controller 50.

The controller 50 of the present embodiment may be configured as described above. According to this configuration, each of the heat radiation members, namely the FET 61 and the diode bridge 62 that are mounted on the electric circuit board 60, may be configured to contact the thick wall portion 73*b* of the rear wall 73 of the controller case 70. Because of this configuration, when heat generated from the FET 61 and the diode bridge 62, collectively, is applied to the thick wall portion 73*b*, this applied heat may be transferred to the general portion 73*a* of the controller case 70 due to beat uniformity, by effecting heat dissipation by virtue of being adjacent to the thick wall portion 73*b*. In other words, the general portion 73*a* may absorb the heat applied to the thick wall portion 73*b*. As a result, even though outside air (cooling air) introduced from the intake port 11*a* by use of the cooling fan does not sufficiently reach the controller 50, the controller is nevertheless able to be cooled in an effective manner due to effective heat dissipation.

Furthermore, according to this configuration, the high temperature portion 73*c* that receives heat generated from the FET 61 and the diode bridge 62 may occupy a right side portion of the rear wall 73, as indicated by the dashed line in FIG. 7. In contrast, the remaining portion of the rear wall 73 outside of and/or separate from the high temperature portion 73*c* may be the low temperature portion 73*d* that does not directly receive heat generated from the FET 61 and the diode bridge 62, and rather helps to dissipate the heat from the high temperature portion 73*c*. The thick wall portion 73*b* may include the extension portion 73*e* that acts as an intermediary member, and extends from the high temperature portion 73*c* to the low temperature portion 73*d*. Because of this configuration, heat can be transferred from the high temperature portion 73*c* to the low temperature portion 73*d* through the extension portion 73*e* in a reliable manner. In other words, the low temperature portion 73*d* can receive and/or absorb heat that is initially applied to the high temperature portion 73*c* of the thick wall portion 73*b*, in a reliable manner.

Furthermore, according to this configuration, thermal conductivity of aluminum alloy, of which the controller case 70 is made, is 169 to 178 W/mK. Because of this configuration, thermal conductive property of the controller case 70 can be improved.

Furthermore, according to this configuration, the high temperature portion 73*c* of the controller 50 may be connected to the heat sink 40 through the heat pipe 30. Because of this configuration, heat transfer can take place direct from the high temperature portion 73*c* of the controller 50. As a result, by re-routing heat directly to the heat sink 40 through the pipe 30, the controller 50 can be cooled in an effective manner.

Furthermore, according to this configuration, the IPM 63 that is mounted on the electric circuit board 60 of the controller 50 may contact the first linear member 31 (heated portion) of the heat pipe 30. Because of this configuration, additional heat transfer can directly take place from another heat generation source in the controller 50. As a result, the controller 50 can be further cooled in an effective manner.

Furthermore, according to this configuration, the IPM 63 that is mounted on the electric circuit board 60 of the controller 50 may surface-contact the first linear member 31 (heated portion) of the heat pipe 30. Because of this configuration, in comparison with a case where a line contact is employed, the first linear member 31 (heated portion) of the heat pipe 30 can receive heat from the IPM 63 directly in an effective manner.

Furthermore, according to this configuration, the plane portion 31*a* of the first linear member 31 of the heat pipe 30, which surface-contacts the IPM 63, may be covered and held in place by the cover 76 that is screw-fixed to the controller case 70 by use of the third screws B3. Because of this configuration, the plane portion 31*a* of the first linear member 31 of the heat pipe 30 may be pressed upwards by the cover 76 against the IPM 63. As a result, this configuration results in a state where the plane portion 31*a* of the first linear member 31 of the heat pipe 30 surface-contacts the IPM 63, and where such contact can be firmly maintained (a close surface-contact can be employed) due to the affixing of the third screws B3. As a result, the first linear member 31 can receive heat from the IPM 63 in a more effective manner.

Furthermore, according to this configuration, the general member 31*b* of the heat pipe 30 may be disposed along both the thick wall portions 71*g* and 71*h*, in the center of both of them in the front to rear direction. Because of this configuration, the thick wall portions 71*g* and 71*h* may also serve as a protection for the general portion 31*b* of the heat pipe 30.

It is noted that the present teachings are not limited to the above-described embodiments, and it is understood that variations and modifications may be effected without departing from the spirit and scope of the present teachings. A configuration in which a heated portion of the heat pipe is disposed at a position lower than or as high as a heat dissipation portion of the heat pipe can be applied not only to the portable circular saw exemplified in the electric power tool 1 of the present embodiment but also to any other rotary cutting tool in which a cutting depth is adjustable, especially in which a cutting depth is large.

Furthermore, the electric power tool 1 may be operated not only by AC power but also by DC power such as, for example, a rechargeable battery. Furthermore, material of the heat pipe 30 or the heat sink 40 can be changed to other material having high thermal conductivity. Furthermore, material for the controller case may be acceptable if its thermal conductivity is 120 to 200 W/mK.

Furthermore, in the present embodiment, the heat dissipation members of FET 61 and the diode bridge 62 contact the thick wall portion 73*b*. However, the FET 61 and the diode bridge 62 may directly contact the thick wall portion 73*b*. The same applies to the IPM 63.

Furthermore, the heat sink 40 may be assembled to the motor housing 11 in an indirect manner (via a member such as, for example, a bracket). Alternatively, the heat sink 40 may be assembled to the stator 23 of the motor 20. In any case, as a result, the heat sink 40 may be assembled to the motor housing 11.

Furthermore, in the present embodiment, the controller 50 controls driving of the motor 20 of the electric power tool 1. However, the controller 50 may also control an on/off of an illumination device or a buzzer (audible source).

Furthermore, in the present embodiment, the electric power tool 1 may be the portable circular saw. However, the electric power tool 1 may not be limited to the portable circular saw, but may be a grinder or a hummer.

Furthermore, in the present embodiment, the heat sink 40 (heat sink main body 41) may be formed in an annular shape. However, the heat sink 40 may also be formed in approximately in an annular shape but not in a full annular shape, for example, in such a manner that a part of the annular ring is cutout (in a C-shape).

What is claimed is:

1. A controller that controls a power tool, comprising:
   an electric circuit board;
   a controller case that houses the electric circuit board and includes a first thick wall portion that is thicker than other wall portions of the controller case;
   a first electric element that (1) generates heat and/or is to be cooled on the electric circuit board and (2) contacts the first thick wall portion of the controller case;
   a second electric element that (1) generates heat and (2) is on the electric circuit board;
   a heat pipe (1) extending from the controller case to a heat sink provided in a power tool main body of the power tool and (2) including a plane portion at an end; and
   a cover that covers a portion of the heat pipe and is attached to the controller case, wherein the cover maintains the plane portion of the heat pipe in direct surface-contact with the second electric element.

2. The controller according to claim 1, wherein:
   the controller case includes (1) a high temperature portion that contacts the first electric element such that a temperature of the high temperature portion can increase due to contact of the high temperature portion with the first electric element and (2) a low temperature portion separate from the high temperature portion; and
   the first thick wall portion extends from the high temperature portion to the low temperature portion.

3. The controller according to claim 1, wherein the controller case is made of material with a thermal conductivity which is 120 to 200 W/mK.

4. The power tool that includes the controller according to claim 1, wherein a high temperature portion of the controller is connected to a low temperature portion of a power tool main body of the power tool through the heat pipe.

5. The power tool according to claim 4, wherein the heat pipe is along a second thick wall portion of the controller case that is thicker than the other wall portions of the controller case.

6. The controller according to claim 1, wherein:
   the second electric element is on an underside of the electric circuit board; and
   the cover is attached to an underside surface of the controller case.

7. The controller according to claim 1, wherein the heat pipe includes (i) a first linear member with the plane portion, (ii) a second linear member that extends from an end of the first linear member and is perpendicular to the first linear member, and (iii) a curved portion extending from an end of the second linear member.

8. The controller according to claim 7, wherein:
   the heat sink has a circular shape and includes an interior hole; and
   the curved portion of the heat pipe is affixed to the heat sink such that the curved portion of the heat pipe is adjoined to a part of a circular circumference of the heat sink.

9. The controller according to claim 1, wherein:
the first electric element includes a field effect transistor and a diode bridge; and
the second electric element includes an integrated power module.

10. A controller that controls a power tool, comprising:
a rectangular box-shaped controller case that houses a flat rectangular electric circuit board and includes a thick wall portion that is thicker than other wall portions of the controller case;
a field effect transistor and diode bridge on a rear right edge of the circuit board that collectively comprise a first heat generating electric element, the first heat generating electric element being in contact with the thick wall portion of the controller case on a rear peripheral edge of the case;
a heat pipe;
a circular heat sink; and
a cover; wherein:
the controller case includes (i) a high temperature portion that contacts the first electric heat generating element such that a temperature of the high temperature portion can increase due to contact of the high temperature portion with the first electric heat generating element and (ii) a low temperature portion separate from the high temperature portion;
the thick wall portion extends from the high temperature portion to the low temperature portion;
the heat pipe (1) connects the high temperature portion of the controller case to a low temperature part of a power tool main body of the power tool and (2) has (i) a curved portion at a front terminal end adjacent to the circular heat sink, (ii) a first linear member which is a linearly extending pipe region at a rear portion of the heat pipe with a plane portion at a rear end of the first linear member and (iii) a second linear member which is a linearly extending pipe region that extends between the curved portion and the first linear member and is perpendicular to the first linear member;
the circular heat sink has an interior hole to which the curved portion of the heat pipe is affixed in such a manner that the curved portion of the heat pipe is adjoined to a part of a circular circumference of the heat sink; and
the cover (1) covers the plane portion of the first linear member of the heat pipe and (2) is connected to an underside surface of the controller case such that the plane portion of the first linear member is in contact with the controller case; and
an upper surface of the plane portion directly contacts an integrated power module on an underside of the electric circuit board.

11. The controller according to claim 10, wherein the integrated power module is at a front edge on the underside of the circuit board and is a second heat generating element.

12. The controller of claim 10, wherein the high temperature portion occupies an upper-right region of the thick wall portion.

13. The controller of claim 12, wherein the thick wall portion includes a portion projecting leftward from its lower-left region, which is a transition region physically in between the high temperature region and the low temperature region, aiding to dissipate heat from the high temperature region to the low temperature region.

14. The controller according to claim 10, wherein the controller case is made of material with a thermal conductivity which is 120 to 200 W/mK.

15. A power tool comprising:
a power tool main body;
a controller configured to control the power tool that includes:
a controller case;
an electric circuit board in the controller case; and
a heat generating electric element on the electric circuit board;
a heat sink in the power tool main body;
a heat pipe extending from the controller case to the heat sink; and
a cover that covers a portion of the heat pipe and is affixed to the controller case;
wherein:
the heat pipe includes a plane portion at one end; and
the cover causes the plane portion of the heat pipe to directly surface-contact the heat generating electric element.

16. The power tool according to claim 15, wherein the controller case is made of material with a thermal conductivity which is 120 to 200 W/mK.

17. The power tool according to claim 15, wherein:
the heat generating electric element is on an underside of the electric circuit board; and
the cover is attached to an underside surface of the controller case.

18. The power tool according to claim 15, wherein the heat pipe includes (1) a first linear member with the plane portion, (ii) a second linear member that extends from an end of the first linear member and is perpendicular to the first linear member, and (iii) a curved portion extending from an end of the second linear member.

19. The power tool according to claim 18, wherein:
the heat sink has a circular shape and includes an interior hole; and
the curved portion of the heat pipe is affixed to the heat sink such that the curved portion of the heat pipe is adjoined to a part of a circular circumference of the heat sink.

20. The power tool according to claim 15, wherein the heat generating electric element includes at least one of a field transistor, a diode bridge, and an integrated power module.

* * * * *